United States Patent
Martin et al.

(10) Patent No.: US 11,237,204 B2
(45) Date of Patent: Feb. 1, 2022

(54) REAL-TIME JITTER IMPAIRMENT INSERTION FOR SIGNAL SOURCES

(71) Applicant: Tektronix, Inc., Beaverton, OR (US)

(72) Inventors: Gregory A. Martin, Lake Oswego, OR (US); Patrick Satarzadeh, San Jose, CA (US); Karen Hovakimyan, San Jose, CA (US); Hungming Chang, Santa Clara, CA (US)

(73) Assignee: Tektronix, Inc., Beaverton, OR (US)

( * ) Notice: Subject to any disclaimer, the term of this patent is extended or adjusted under 35 U.S.C. 154(b) by 352 days.

(21) Appl. No.: 16/538,564

(22) Filed: Aug. 12, 2019

(65) Prior Publication Data
US 2020/0209307 A1    Jul. 2, 2020

Related U.S. Application Data

(60) Provisional application No. 62/787,210, filed on Dec. 31, 2018.

(51) Int. Cl.
*G01R 31/28* (2006.01)
*G01R 31/3167* (2006.01)
*G01R 31/317* (2006.01)
*G01R 31/319* (2006.01)

(52) U.S. Cl.
CPC ..... *G01R 31/2841* (2013.01); *G01R 31/3167* (2013.01); *G01R 31/31709* (2013.01); *G01R 31/31922* (2013.01)

(58) Field of Classification Search
None
See application file for complete search history.

(56) References Cited

U.S. PATENT DOCUMENTS

| 7,013,257 | B1 * | 3/2006 | Nolan | H04B 17/0087 |
| | | | | 370/248 |
| 9,020,019 | B2 * | 4/2015 | Dark | H04B 17/104 |
| | | | | 375/227 |
| 2008/0228426 | A1 | 9/2008 | Calvin et al. | |
| 2009/0195525 | A1 | 8/2009 | Karapattu et al. | |
| 2011/0235694 | A1 * | 9/2011 | Stephens | G01R 31/31709 |
| | | | | 375/226 |
| 2013/0301691 | A1 | 11/2013 | Wang et al. | |
| 2018/0364307 | A1 | 12/2018 | Fu et al. | |
| 2019/0383873 | A1 * | 12/2019 | Hojabri | G01R 31/3187 |
| 2020/0212923 | A1 * | 7/2020 | Martin | H03M 1/1071 |

FOREIGN PATENT DOCUMENTS

EP    3674724 A1 *  7/2020  ......... G01R 31/3167

OTHER PUBLICATIONS

European Patent Office, Extended European Search Report and Written Opinion for European Application 19220213.3, dated May 11, 2020, 7 pages, Munich, Germany.

* cited by examiner

*Primary Examiner* — Jermele M Hollington
(74) *Attorney, Agent, or Firm* — Miller Nash LLP; Andrew J. Harrington (57) ABSTRACT

A test and measurement device having a signal source, including an impairment generator configured to output an impairment and a waveform synthesizer. The waveform synthesizer receives an input digital signal to be synthesized, receives the impairment, and synthesizes a synthesized digital signal based on the input digital signal and the impairment. The test and measurement instrument also includes a fixed sample rate digital-to-analog converter configured to receive a clock signal and the synthesized digital signal and output an analog signal.

20 Claims, 4 Drawing Sheets

REAL-TIME JITTER IMPAIRMENT INSERTION FOR SIGNAL SOURCES

CROSS-REFERENCE TO RELATED APPLICATIONS

This application claims the benefit of provisional U.S. Pat. App. No. 62/787,210, filed Dec. 31, 2018, the entire contents of which are hereby incorporated by reference into this application.

FIELD OF THE INVENTION

This disclosure is directed to systems and methods for synthesizing waveforms having jitter and other timing related impairments in test and measurement instruments.

BACKGROUND

Many communication standards outline a series of stressed test scenarios to determine if a device under test (DUT) passes all performance tests with a specified margin for conformance. Test and measurement instruments having a signal source, such as, for example, arbitrary waveform or function generators and bit error rate testers (BERTs), may be used to generate waveforms for stress testing to measure a performance margin of a DUT in response to the received signals.

Communication standards can require jitter impairments to be added to the desired data waveform that come in many forms, including, but not limited to, random, bounded/unbounded, sinusoidal, high/low frequency jitter, clock wander, etc. Given this, a test and measurement instrument having a signal source should have the ability to insert jitter impairments with the attributes specified by given communication standards. However, conventional test and measurement instruments often do not have a large enough baud rate range and/or flexible enough impairment generation capabilities to cover multiple standards effectively.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure can add impairments to a desired data waveform to be synthesized, such as non-linearity, jitter, noise, crosstalk, intersymbol interference (ISI), channel frequency response, etc., to determine the margins required for the receiver DUT to properly record the desired data waveform, with an acceptable bit error rate (BER), based on the impaired data waveform. Embodiments of the disclosure can add the impairments, such as jitter or spread spectrum clocking, to the desired data waveform using either a digital signal processing (DSP) or analog means by modulating a signal source DAC sample clock in real-time, as will be discussed in more detail below.

Embodiments disclosed herein can be implemented either in real-time DSP hardware, such as a field programmable gate array (FPGA) or Application Specific Integrated Circuits (ASICs) or by pre-computation, if replication/interpolation of a waveform is done in advance and loaded to a waveform pattern memory in the signal source that is used to generate the real-time output waveform at the DAC sample rate.

Figure 1:
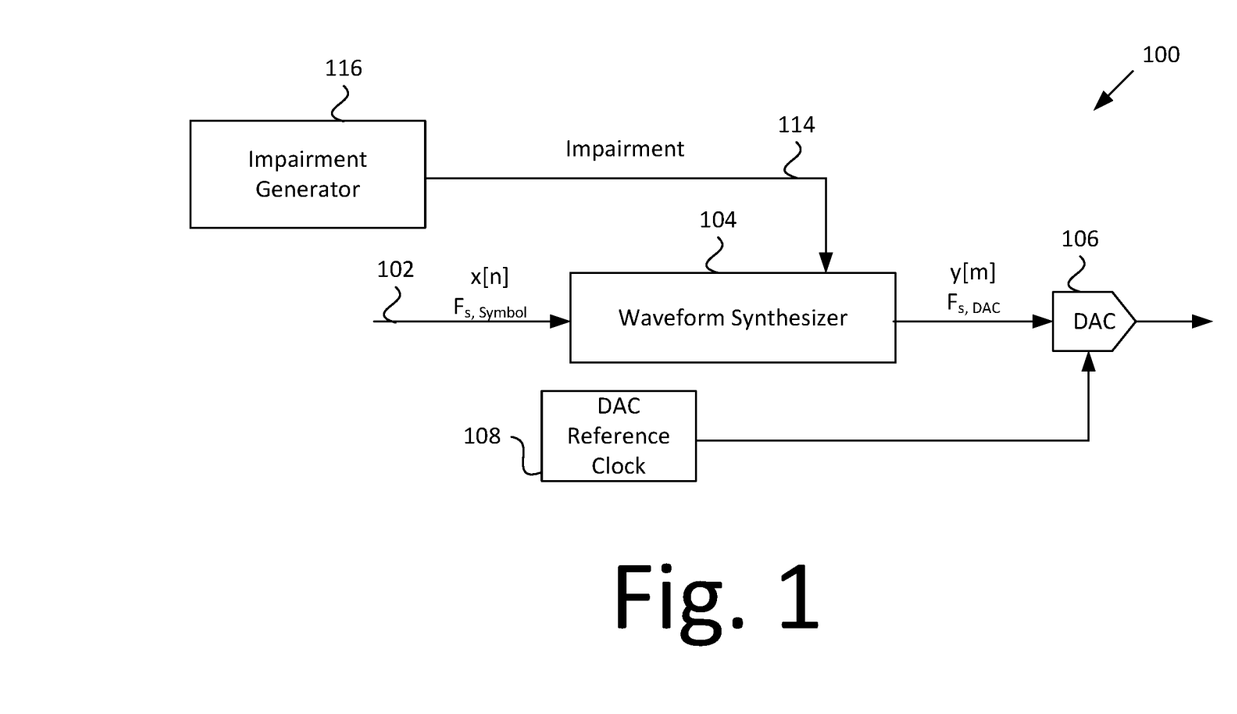
FIG. 1 is a block diagram of a test and measurement instrument having a waveform synthesizer according to some embodiments of the disclosure.

FIG. 1 is a block diagram of a test and measurement instrument 100 having a waveform synthesizer according to some embodiments of the disclosure. An input waveform 102, x[n], is a digital representation of the desired output waveform symbol values to be generated, which may be sampled at the baud rate of the waveform to be synthesized ($F_{s,\ symbol}$). The input waveform 102 can be received at waveform synthesizer 104, which synthesizes the waveform, y[m], according to the sample rate ($F_{s,\ DAC}$) of a DAC 106.

The synthesized waveform, y[m], is received at the DAC 106 and converted to an analog signal. The DAC 106 also may receive a reference clock 108 from another component of the test and measurement instrument. In some embodiments, after the synthesized waveform is converted to an analog signal through the DAC 106, the analog waveform may be filtered by an analog low-pass filter, which can be used to remove signal content above the first Nyquist zone of the DAC 106 output. This may remove the zero-order hold effects of traditional DACs in the higher Nyquist zones, which causes $\sin(\pi f)/(\pi f)$ replication of the waveform spectrum in the first Nyquist zones across the higher Nyquist zones. The analog waveform may be output to a port, which may be connected through a cable to a device under test.

In embodiments or situations where the DAC 106 sample rate ($F_{s,\ DAC}$) is an integer multiple of the waveform baud rate ($F_{s,\ symbol}$), the analog low-pass filter may be removed or bypassed, and the output from the DAC 106 may be sent directly to the port since the zero-order hold response of the DAC 106 is coherent to the waveform that is being synthesized and can reinforce the desired symbol transitions in the output waveform for waveform signaling methods where symbol values are held constant across the entire symbol period, such as non-return to zero (NRZ) and pulse amplitude modulation (PAM).

An impairment 114 may be sent to the waveform synthesizer 104, which is added to the synthesized waveform, y[m], prior to being sent to the DAC 106. The impairment 114, as mentioned above, may be used to test a DUT connected to the port. That is, the DUT receives the impaired waveform and can be tested to determine if the DUT adequately recovers the intended data waveform (x[n]). The impairment 114 may be jitter, spread spectrum clocking (SSC) impairments, and/or other timing or phase impairments, as will be discussed in more detail below. The impairment 114 may come from an impairment generator 116, which may be a memory that stores a number of different impairments required by testing standards or a processor that can generate the impairments either based on testing standards stored in the memory or an impairment received from a user input.

In some embodiments, the impairment generator 116 may receive an input signal provided by a user (not shown). The input signal may be used by the impairment generator 116 to generate the impairment 114. In some embodiments, the impairment 114 is the received input signal, while in other embodiments, the impairment 114 is generated using the input signal.

The waveform synthesizer 104 may synthesize the waveform in a number of different ways, including, but not limited to, fractional replication and linear edge interpolation, fractional replication and zero insertion at edge, fractional replication with a data sample replication to a highly oversampled rate followed by a fractional decimation filter, fractional replication with pre-computed look up tables for edge value interpolation, etc.

Using a direct linear interpolation approach as an example, where the DAC input samples, y[m], may be computed from the input waveform 102, x[n], using equations (1), (2), and 3):

$$n[m] = \left\lfloor \frac{m}{r} \right\rfloor \quad (1)$$

$$\mu[m] = \frac{m}{r} - n[m] \quad (2)$$

$$y[m] = (1 - \mu[m]) \cdot x[n[m]] + \mu[m] \cdot x[n[m] + 1] \quad (3)$$

Where $$r = \frac{F_{s,DAC}}{F_{s,symbol}}.$$

that is, r is the ratio of the DAC 106 output sample rate and the input waveform 102 baud rate. Per the equations above, the value of μ[m] will dynamically vary for each DAC 106 sample period to achieve the desired fractional resampling rate between the waveform baud rate ($F_{s,\ Symbol}$) and the DAC 106 output sample rate ($F_{s,DAC}$). Thus, the variable μ[m] will reflect the placement of the symbol edge transitions, with sub-sample resolution relative to the DAC 106 output sample rate, for when a transition occurs between successive x[n] and x[n+1] input symbols. An edge in the waveform y[m] only occurs when x[n+1] is not equal to x[n]. Changing the value of μ[m] from its nominal value computed in equation (2) will translate to shifting the edge transition earlier or later in time relative to the nominally resampled output data waveform. This modulation of the edge location in the output waveform amounts to phase modulation or jitter insertion, which is shown in equation (4) for μ[m]:

$$\mu'[m] = \frac{m}{r} - n[m] + jit[n[m]] + ssc[n[m]] \quad (4)$$

Where jit[n] corresponds to a jitter phase modulation amount for a given symbol transition and ssc[n] corresponds to the phase modulation for a given symbol transition to emulate spread spectrum clocking (SSC) in the output waveform. Other timing and phase impairments may be added to equation (4) in a similar fashion.

Phase modulation due to jitter, SSC, and/or other timing or phase impairments can cause the symbol transition edges to move to a different DAC 106 output sample period relative to the sample period where the transition would normally occur before adding in the phase modulation. As such, a correction of an output symbol transition location may be beneficial, as shown in equations (5) and (6):

$$\mu[m] = \mu'[m] \bmod 1 \quad (5)$$

$$e[m] = \mu[\dot{m}] - \mu[m] \quad (6)$$

Where e[m] determines the integer input sample index correction value to adjust the input samples 102 used in the linear interpolation process to handle cases where the jitter, SSC, and/or other phase modulation cause μ'[m] to be less than zero or greater than or equal to one, i.e., wrap between successive input sample periods.

The resulting equation for the waveform y[m], with the input sample index correction is shown in equation (7):

$$y[m] = (1 - \mu[m]) \cdot x[n[m] + e[m]] + \mu[m] \cdot x[n[m] + e[m] + 1] \quad (7)$$

Figure 2:
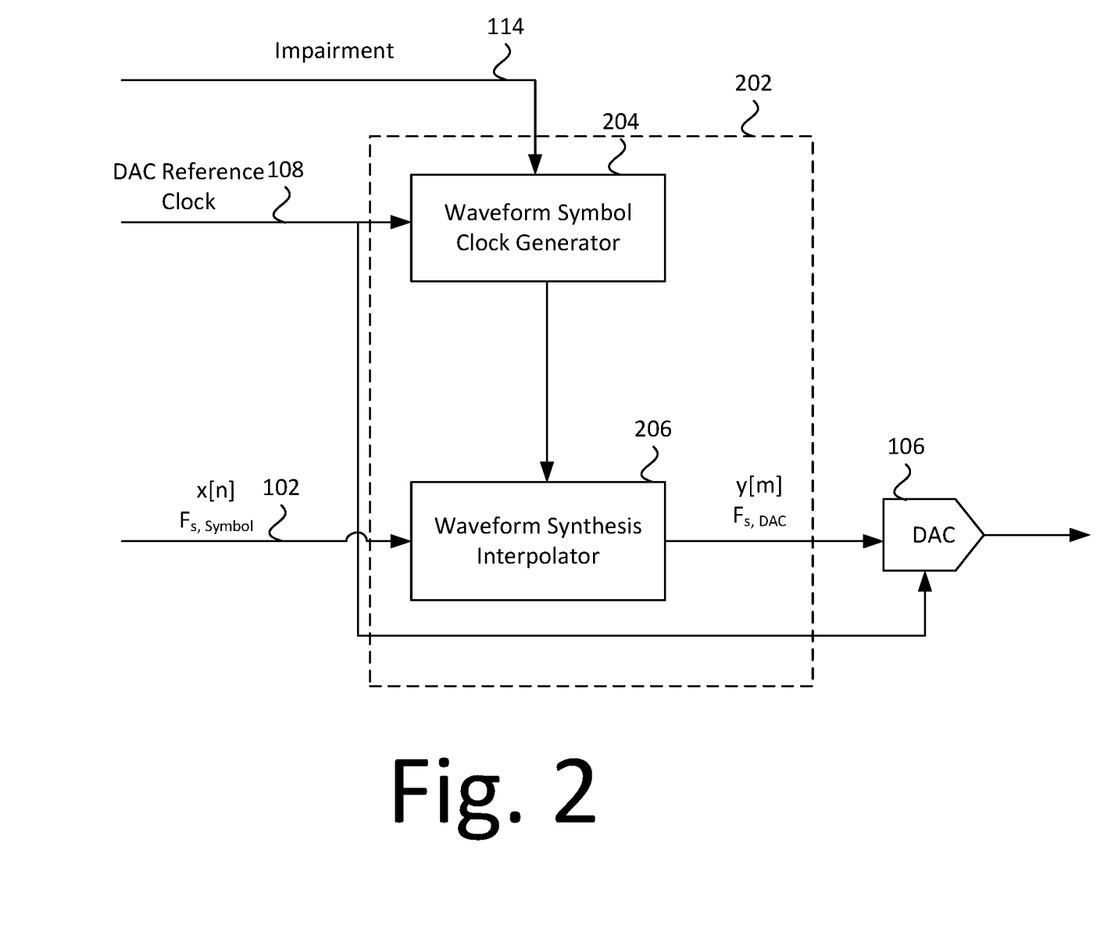
FIG. 2 is a block diagram of an example of a waveform synthesizer according to some embodiments of the disclosure.

FIG. 2 illustrates another example embodiment for modifying a synthesized waveform y[m] with jitter, SSC, and/or other timing or phase impairments. A waveform synthesizer 202 may include, for example, a waveform symbol clock generator 204 and a waveform synthesis interpolator 206. The waveform symbol clock generator 204 also receives the DAC reference clock 108 from another component of the test and measurement instrument 100, as well as an impairment 114. The impairment may come, for example, from the impairment generator 116.

The waveform symbol clock generator 204 outputs symbol transition events and symbol transition sub-sample phases to the waveform synthesis interpolator 206 which also receives the input signal 102, x[n]. The waveform synthesis edge interpolator 206 outputs a digital signal, y[m], to be converted to an analog signal through DAC 106. The embodiment of FIG. 2 may also include an analog filter to filter the analog signal before being output to a port, similar to FIG. 1.

The waveform symbol clock generator 204 outputs symbol transition events and symbol transition sub-sample phases based on the DAC reference clock 108 and the impairment 114. That is, the symbol transition events and symbol transition sub-sample phases may be modified based on the impairment 114. The waveform synthesis interpolator 206 can translate the input waveform 102, x[n], at the baud rate, to an output waveform, y[m], at the DAC 106 sample rate by using a DSP fractional interpolation and/or replication operation. The symbol transition time phase modulation can include both integer and fractional sample period phase modulation components, relative to the DAC 106 sample period. Thus, the phase modulation range can extend multiple DAC 106 sample periods relative to the normal symbol transition times before jitter, SSC, and/or other timing or phase impairments have been applied.

Figure 3:
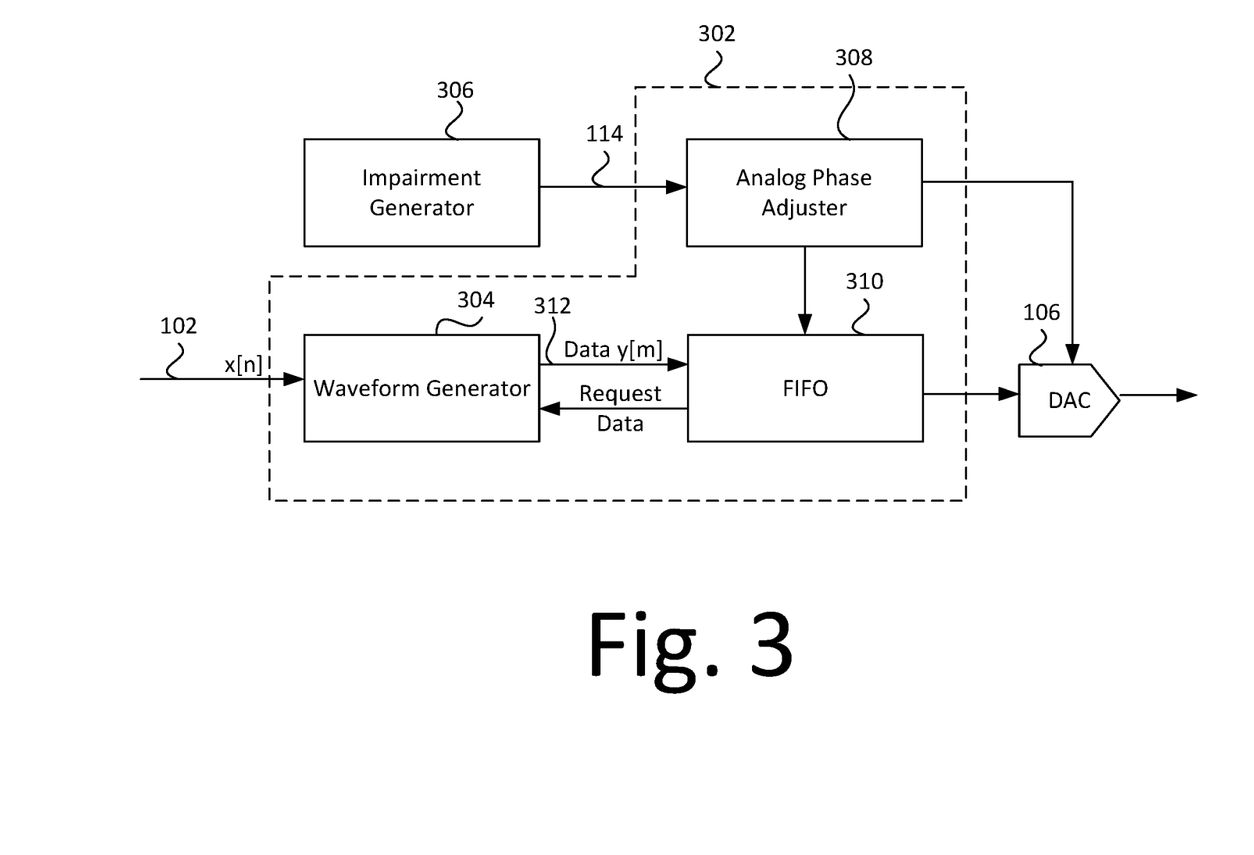
FIG. 3 is a block diagram of an example of a waveform synthesizer according to some embodiments of the disclosure.

The embodiments of FIGS. 1 and 2, advance or delay the timing of transitions between symbol values in the baud-rate input waveform to apply phase modulation through DSP manipulation of the output waveform, y[m], values. FIG. 3, on the other hand, is an example embodiment for an analog operation for inserting an impairment into a generated waveform.

Similar to FIGS. 1 and 2, an input waveform 102 is received at a waveform synthesizer 302 and output to a DAC 106. The output of the DAC 106 may be further filtered through an analog filter prior to being output to a port, which may be connected to a device under test.

The waveform synthesizer 302 includes a waveform generator 304, which may generate an output waveform, y[m], at the DAC 106 sample rate using any of the above-discussed operations, such as, but not limited to, fractional replication and linear edge interpolation, fractional replication and zero insertion at edge, fractional replication with a data sample replication to a highly oversampled rate followed by a fractional or integer decimation filter, fractional replication with pre-computed look up tables for edge value interpolation, etc.

The waveform synthesizer 302 receives an impairment 114 from an impairment generator 306, which, in this example embodiment, outputs a digital codeword that specifies the amount of phase modulation for jitter, SSC, and/or other timing or phase impairments to be inserted for a given output sample. The digital codeword may come, for example, from jitter, SSC, and/or other timing or phase impairments generation operations which create the type of jitter, SSC, and/or other timing or phase impairments as dictated by a desired test. For example, if a user wants to perform a sinusoidal jitter tolerance test, then the impairment generator 306 may be a numerically controlled oscillator (NCO). As mentioned above, in some embodiments, a memory may store a number of different types of jitter or SSC that are required for different tests, and the impairment generator 306 may generate these codewords based on a type of test selected by a user. In other embodiments, a user may enter the specific type of impairment to be used through a user interface of the test and measurement instrument and the impairment generator 306 outputs the digital codeword based on this information. The codewords output by the impairment generator 306 may be updated for each symbol period of the input waveform 102.

The digital codeword is sent to an analog phase adjuster 308, which may be, for example, a phase interpolator (PI) or analog delay lines (ADL). A buffer 310, such as a first in, first out buffer 310 shown in FIG. 3, receives an output from the analog phase adjuster 308 and the waveform generator 304. The buffer 310 allows the waveform generator 304 to run at a fixed clock rate. The buffer 310 can also handle situations where the phase modulation wraps between successive sample periods, as the jitter, SSC, and/or other timing or phase impairments phase modulation can result in scenarios where the next input sample value is mapped to a DAC 106 symbol value one sample period sooner or later than would otherwise occur with no phase modulation added. The output from the analog phase adjuster 308 is also sent to the DAC 106 as a jittered clock signal, rather than receiving a fixed-rate reference clock signal, as shown in FIGS. 1 and 2.

Flow control may be used to throttle the input data to the buffer 310 when the buffer 310 is near full and hold off the start of output waveform generation by DAC 106 until the buffer 310 has accumulated a sufficient buffer of valid samples to accommodate dynamic changes in the sample period in DAC 106. Throttling the input data to the buffer 310 can regulate the dynamic changes in the DAC 106 output sample rate for cases where the digital feed path 312 feeding the DAC 106 needs to be implemented with a fixed rate clock, as opposed to a continuously varying clock rate that changes in lockstep with the phase modulated DAC 106 effective output sample rate. In such a case, the digital data path 312 feeding the buffer 310 can operate faster than the highest possible instantaneous DAC 106 output sample rate.

If a phase interpolator is used for the analog phase adjuster 308, the analog phase adjuster 308 can rotate up to one output sample period in range (relative to DAC 106) and rollover glitch free. If analog delay lines are used for the analog phase adjuster 308, a full output sample period range can also be supported, but will do so with the concatenation of analog delay elements, i.e., chains of inverters, passive delay lines, etc.

Figure 4:
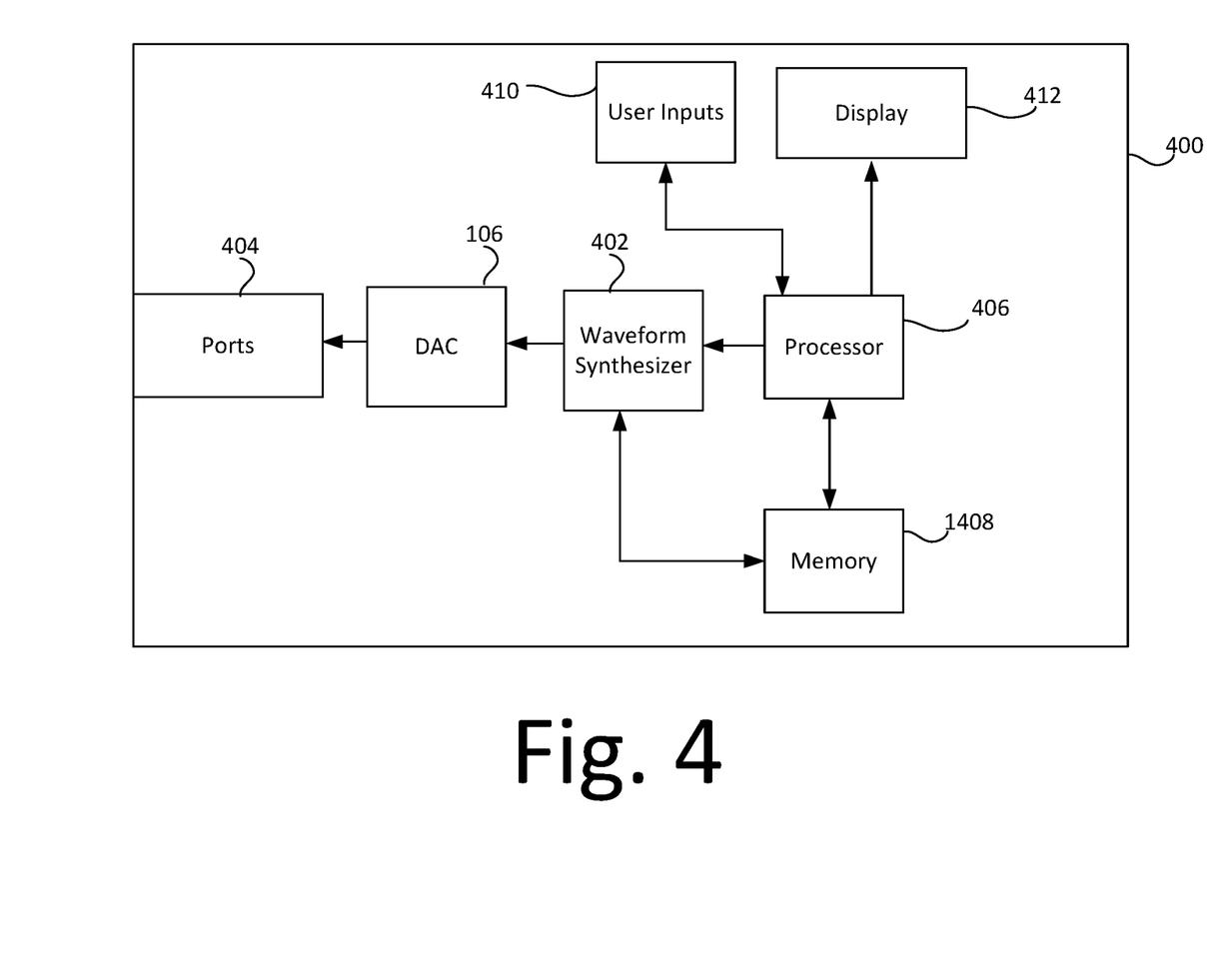
FIG. 4 is a block diagram of a test and measurement instrument according to some embodiments of the disclosure.

FIG. 4 illustrates an example test and measurement instrument 400 with a waveform synthesizer 402 and a DAC 106. The waveform synthesizer 402 may be any of the waveform synthesizers 104, 202, and 302 discussed above. The test and measurement instrument 400, may be, for example, an arbitrary waveform generator, arbitrary function generator, bit error rate tester (BERT) or any test and measurement instrument that outputs a signal source.

The test and measurement instrument 400 includes one or more ports 404 which may be any electrical or optical signaling medium. Ports 404 may include receivers, transmitters, and/or transceivers, as well as potentially electrical-to-optical and/or optical-to-electrical converters. The ports 404 are coupled with the waveform synthesizer 402 through the DAC 106. The waveform synthesizer 402 is connected to one or more processors 406. Although only one processor 406 is shown in FIG. 4 for ease of illustration, as will be understood by one skilled in the art, multiple processors 406 of varying types may be used in combination, rather than a single processor 406. In some embodiments, the waveform synthesizer 402 may be part of the one or more processors 406.

The one or more processors 406 may be configured to execute instructions from memory 408 and may perform any methods and/or associated steps indicated by such instructions. Memory 408 may be implemented as processor cache, random access memory (RAM), read only memory (ROM), solid state memory, hard disk drive(s), or any other memory type. Memory 408 acts as a medium for storing data, computer program products, and other instructions. For example, the one or more processors 406 may output a digital signal to the Waveform synthesizer 402 that is to be output as an analog signal, such as described above, to a device under test through ports 404.

User inputs 410 are coupled to the one or more processors 406. User inputs 410 may include a keyboard, mouse, trackball, touchscreen, and/or any other controls employable by a user to with a GUI on the display 412. The display 412 may be a digital screen, a cathode ray tube based display, or any other monitor to display waveforms, measurements, and other data to a user. While the components of test instrument 400 are depicted as being integrated within test and measurement instrument 400, it will be appreciated by a person of ordinary skill in the art that any of these components can be external to test instrument 400 and can be coupled to test instrument 400 in any conventional manner (e.g., wired and/or wireless communication media and/or mechanisms). For example, in some embodiments, the display 412 may be remote from the test and measurement instrument 400.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), Field Programmable Gate Arrays (FPGAs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement device having a signal source, comprising an impairment generator configured to output an impairment; a waveform synthesizer configured to: receive an input digital signal to be synthesized, receive the impairment, and synthesize a synthesized digital signal based on the input digital signal and the impairment; and a fixed sample rate digital-to-analog converter configured to receive a clock signal and the synthesized digital signal and output an analog signal.

Example 2 is the test and measurement device of example 1, wherein the waveform synthesizer includes: a waveform symbol clock generator configured to receive the impairment and a reference clock and output a transition event signal based on the impairment and the reference clock; and a waveform synthesis interpolator configured to receive the transition event signal and the input signal and output the synthesized digital signal at the fixed sample rate of the digital-to-analog converter.

Example 3 is the test and measurement device of example 2, wherein the transition event signal indicates a timing of a transition event, and the timing of the transition event is advanced or delayed based on the impairment.

Example 4 is the test and measurement device of any one of examples 1-3, wherein the waveform synthesizer includes: a waveform generator configured to output the synthesized digital signal; an analog phase adjuster configured to receive the impairment and output the clock signal as a jittered clock signal based on the impairment; and a buffer configured to store the synthesized digital signal and output a portion of the synthesized digital signal in response to the clock signal.

Example 5 is the test and measurement device of example 4, wherein the analog phase adjuster is a phase interpolator.

Example 6 is the test and measurement device of example 4, wherein the analog phase adjuster includes analog delay lines.

Example 7 is the test and measurement device of any one of examples 4-6, wherein the buffer is a first in, first out buffer.

Example 8 is the test and measurement device of any one of examples 1-7, wherein the impairment includes at least one of jitter or spread spectrum clocking impairment.

Example 9 is the test and measurement device of any one of examples 1-8, wherein the waveform synthesizer is further configured to correct the synthesized digital waveform if the impairment causes a sample of the synthesized digital signal to be in a different sample period.

Example 10 is a method for synthesizing a waveform, comprising receiving an input digital signal to be synthesized; generating an impairment; synthesizing a synthesized digital signal based on the input digital signal and the impairment; and converting the synthesized digital signal to an analog signal having the impairment through a fixed sample rate digital-to-analog converter.

Example 11 is the method of example 10, wherein synthesizing the synthesized digital signal includes generating a transition event signal based on the impairment and a reference clock; and generating the synthesized digital signal having the impairment at the fixed sample rate of the digital-to-analog converter.

Example 12 is the method of example 11, wherein the transition event signal indicates a timing of a transition event, and the timing of the transition event is advanced or delayed based on the impairment.

Example 13 is the method of any one of examples 10-12, wherein synthesizing the synthesized digital signal includes: storing the synthesized digital signal in a buffer and outputting the synthesized digital signal to the digital-to-analog converter based on the impairment; generating a jittered clock signal by an analog phase adjuster; and transmitting the jittered clock signal to the digital-to-analog converter.

Example 14 is the method of example 13, wherein the analog phase adjuster is a phase interpolator.

Example 15 is the method of example 13, wherein the analog phase adjuster includes analog delay lines.

Example 16 is the method of any one of examples 13-16, wherein the buffer is a first in, first out buffer.

Example 17 is the method of any one of examples 10-16, wherein the impairment includes at least one of jitter or spread spectrum clocking impairment.

Example 18 is the method of any one of examples 10-17, further comprising correcting the synthesized digital waveform if the impairment causes a sample of the synthesized digital signal to be in a different sample period.

Example 19 is one or more computer-readable storage media comprising instructions, which, when executed by one or more processors of a test and measurement instrument, cause the test and measurement instrument to generate a digital signal to be synthesized; generate an impairment; synthesize a synthesized digital signal based on the input digital signal and the impairment; and convert the synthesized digital signal to an analog signal having the impairment through a fixed sample rate digital-to-analog converter.

Example 20 is the one or more computer-readable storage media of example 19, wherein synthesizing the synthesized digital signal includes generating a transition event signal based on the impairment and a reference clock; and generating the synthesized digital signal having the impairment at the fixed sample rate of the digital-to-analog converter.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement device having a signal source, comprising:
   an impairment generator configured to output an impairment;
   a waveform synthesizer configured to:
      receive an input digital signal to be synthesized,
      receive the impairment, and
      synthesize a synthesized digital signal based on the input digital signal and the impairment; and
   a fixed sample rate digital-to-analog converter configured to receive a clock signal and the synthesized digital signal and output an analog signal.

2. The test and measurement device of claim 1, wherein the waveform synthesizer includes:
   a waveform symbol clock generator configured to receive the impairment and a reference clock and output a transition event signal based on the impairment and the reference clock; and
   a waveform synthesis interpolator configured to receive the transition event signal and the input signal and output the synthesized digital signal at the fixed sample rate of the digital-to-analog converter.

3. The test and measurement device of claim 2, wherein the transition event signal indicates a timing of a transition event, and the timing of the transition event is advanced or delayed based on the impairment.

4. The test and measurement device of claim 1, wherein the waveform synthesizer includes:
   a waveform generator configured to output the synthesized digital signal;
   an analog phase adjuster configured to receive the impairment and output the clock signal as a jittered clock signal based on the impairment; and
   a buffer configured to store the synthesized digital signal and output a portion of the synthesized digital signal in response to the clock signal.

5. The test and measurement device of claim 4, wherein the analog phase adjuster is a phase interpolator.

6. The test and measurement device of claim 4, wherein the analog phase adjuster includes analog delay lines.

7. The test and measurement device of claim 4, wherein the buffer is a first in, first out buffer.

8. The test and measurement device of claim 1, wherein the impairment includes at least one of jitter or spread spectrum clocking impairment.

9. The test and measurement device of claim 1, wherein the waveform synthesizer is further configured to correct the synthesized digital waveform if the impairment causes a sample of the synthesized digital signal to be in a different sample period.

10. A method for synthesizing a waveform, comprising:
    receiving an input digital signal to be synthesized;
    generating an impairment;
    synthesizing a synthesized digital signal based on the input digital signal and the impairment; and
    converting the synthesized digital signal to an analog signal having the impairment through a fixed sample rate digital-to-analog converter.

11. The method of claim 10, wherein synthesizing the synthesized digital signal includes:
    generating a transition event signal based on the impairment and a reference clock; and
    generating the synthesized digital signal having the impairment at the fixed sample rate of the digital-to-analog converter.

12. The method of claim 11, wherein the transition event signal indicates a timing of a transition event, and the timing of the transition event is advanced or delayed based on the impairment.

13. The method of claim 10, wherein synthesizing the synthesized digital signal includes:
    storing the synthesized digital signal in a buffer and outputting the synthesized digital signal to the digital-to-analog converter based on the impairment;
    generating a jittered clock signal by an analog phase adjuster; and
    transmitting the jittered clock signal to the digital-to-analog converter.

14. The method of claim 13, wherein the analog phase adjuster is a phase interpolator.

15. The method of claim 13, wherein the analog phase adjuster includes analog delay lines.

16. The method of claim 13, wherein the buffer is a first in, first out buffer.

17. The method of claim 10, wherein the impairment includes at least one of jitter or spread spectrum clocking impairment.

18. The method of claim 10, further comprising correcting the synthesized digital waveform if the impairment causes a sample of the synthesized digital signal to be in a different sample period.

19. One or more computer-readable storage media comprising instructions, which, when executed by one or more processors of a test and measurement instrument, cause the test and measurement instrument to:
  generate a digital signal to be synthesized;
  generate an impairment;
  synthesize a synthesized digital signal based on the input digital signal and the impairment; and
  convert the synthesized digital signal to an analog signal having the impairment through a fixed sample rate digital-to-analog converter.

20. The one or more computer-readable storage media of claim 19, wherein synthesizing the synthesized digital signal includes:
  generating a transition event signal based on the impairment and a reference clock; and
  generating the synthesized digital signal having the impairment at the fixed sample rate of the digital-to-analog converter.

* * * * *